United States Patent
Chee

[11] Patent Number: 6,084,420
[45] Date of Patent: Jul. 4, 2000

[54] PROBE ASSEMBLY FOR TESTING

[76] Inventor: Wan Soo Chee, 9F-7 No. 14, Lane 609, Sec. 5, Chungshin Rd. Sanchung, Taipei, Taiwan

[21] Appl. No.: 09/199,690

[22] Filed: Nov. 25, 1998

[51] Int. Cl.[7] ...................................................... G01R 1/02
[52] U.S. Cl. ............................................ 324/754; 324/762
[58] Field of Search ..................................... 324/754, 757, 324/758, 760, 765

[56] References Cited

U.S. PATENT DOCUMENTS

| | | | |
|---|---|---|---|
| 5,172,050 | 12/1992 | Swapp | 324/762 |
| 5,666,063 | 9/1997 | Abercrombie et al. | 324/754 |
| 5,763,879 | 6/1998 | Zimmer et al. | 250/306 |
| 5,859,539 | 1/1999 | Wood et al. | 324/758 |
| 5,909,123 | 6/1999 | Budnaitis | 324/760 |

*Primary Examiner*—Josie Ballato
*Assistant Examiner*—T. R. Sundaram
*Attorney, Agent, or Firm*—Hogan & Hartson, LLP

[57] ABSTRACT

An apparatus for probing a semiconductor wafer includes one or more probe tips, the position of each being self-adjustable according to the pressure and direction of the pressure applied to it. In the present invention, elastic probe assemblies (which include the probe tips) independently move to compensate when the wafer expands in size due to thermal expansion and/or changes of probing pressure.

16 Claims, 5 Drawing Sheets

PROBE ASSEMBLY FOR TESTING

BACKGROUND OF THE INVENTION

The present invention relates generally to semiconductor testing devices, and particularly, to devices suitable for testing and/or burning high density integrated circuits such as in DRAM and SRAM devices.

DESCRIPTION OF THE RELATED ART

Integrated circuit devices, including DRAM and SRAM memory devices, are typically tested several times to ensure tests identify wafer fabrication defects. Testing of integrated circuit devices is also used to determine if repairable circuits are present on dies that allow the circuits on the dies to be laser repaired. After packaging, a pre-burn-in test (or an open/short test) is typically carried out to screen out assembly rejects. After burn-in, further tests are used to screen out burn-in rejects. Final tests are used to sort chips according to their allowable operational speed and to screen out rejects caused by the final assembly process, such as defects generated by marking, or to guarantee reliable room temperature operation. Consequently, four or five different tests and anywhere from four to seventy-six hours of testing and burn-in may be used to guarantee quality and reliability for any circuit.

High-density memory integrated circuits, e.g., 64 megabit or larger memory chips, require even longer test times than prior generation memories since more time is needed to test larger memory chips due to the longer execution test patterns. In addition, to achieve an acceptable level of yield from high density memories, extra die repair tests and processes are typically needed. The more significant levels of testing required by higher density memories can be problematic. Conventional wafer probe technology may only test a single die at a time and at most tests only about sixteen dies at one time. The limits on the simultaneous testing of dies is at least partially due to the physical limitations of probe tip layout. It has consequently been necessary to use multiple wafer probe systems simultaneously to achieve acceptable levels of testing throughput. The need for multiple independent probe systems represents an undesirable additional expense.

Conventionally, wafer probing systems use probe tips of different lengths coupled to different test pads on a single die. The use of different length wafer probes can be problematic, however, because different length probe tips may present different impedances between the testing system and the test pads. It can consequently be difficult to achieve proper impedance matching between the different test pads to reliably perform either high frequency testing or high temperature testing. Thus, conventional test probe systems do not provide entirely satisfactory testing solutions for modern, high density memory devices.

It is consequently desirable to provide a probe assembly better suited to testing high density integrated circuit devices and which can accommodate higher density test patterns under testing conditions. For example, it may be desirable for a wafer probe system to better accommodate variations in the relative positions of the probe tips and the surface of a wafer being tested.

SUMMARY OF THE PREFERRED EMBODIMENTS

The present invention relates to an apparatus for probing a semiconductor wafer with one or more probe tips, the position of each probe tip preferably being self-adjustable according to the magnitude and direction of the pressure applied to it. In the present invention, elastic probe assemblies (which include one or more probe tips) preferably are used. Such assemblies allow probe tips to move independently to compensate for wafer movement or variations in test pads positions. Use of preferred embodiments of the present inventions may provide test probe assemblies with either reduced contact resistance or at least more uniform contact resistance. Preferred test probe assemblies could improve signal measurement, reduce contact force to test pads which could otherwise cause damage, avoid sudden pressure from the cassette holding the wafer, and may be responsive to differences in the thermal coefficient between the wafer and the ceramic substrate holding the probe tip assemblies.

A probe tip assembly for adjustably providing an electrical coupling between a portion of a test apparatus and a pad on the surface of a semiconductor comprises a metallic probe tip for contacting the surface of the pad, a metallic bridge member for centrally supporting the metallic probe tip, one or more metallic support members for supporting the bridge member at its periphery, a metallic base member for supporting the support members, the base member being suitable for providing an electrical contact path to a test apparatus, and wherein the bridge member is capable of deflecting toward the base member as pressure is applied between the probe tip and the bonding pad.

In a particular aspect of the invention, a semiconductor probe system can be formed of such probe tip assemblies. Such a semiconductor probe system for adjustably providing an electrical coupling between a test apparatus and one or more contacts on the surface of a semiconductor comprises one or more electrically conductive probe tip assemblies for electrically contacting the contacts on the semiconductor, a ceramic substrate for supporting the probe tip assemblies, a member for elastically provide a force to the probe tip assemblies via the ceramic substrate, a cassette for supporting the wafer, the ceramic substrate and the elastic member in contact with each other, and an electrically conductive feed through path for providing an electrical path between each probe tip assembly and the test apparatus.

The invention is of particular use when the tested semiconductor is one of many chips formed on the surface of a semiconductor wafer.

The invention will be best understood from the following description when read in conjunction with the accompanying drawings.

DESCRIPTION OF THE PREFERRED EMBODIMENTS

The present invention relates to an apparatus for probing a semiconductor wafer with one or more probe tips, the position of each probe tip independently moving according to the magnitude and direction of the pressure applied at the probe tip. Preferred embodiments of the present invention provide probe assemblies (which include the probe tips) in which individual probe tips may independently move by an amount sufficient to compensate for variations in the position of test pads or contacts. Such variations may naturally occur or may occur due to changes on the wafer produced by wafer expansion or contraction or by flexing, whether due to thermal expansion, changes of probing pressure, or otherwise.

Figure 1:
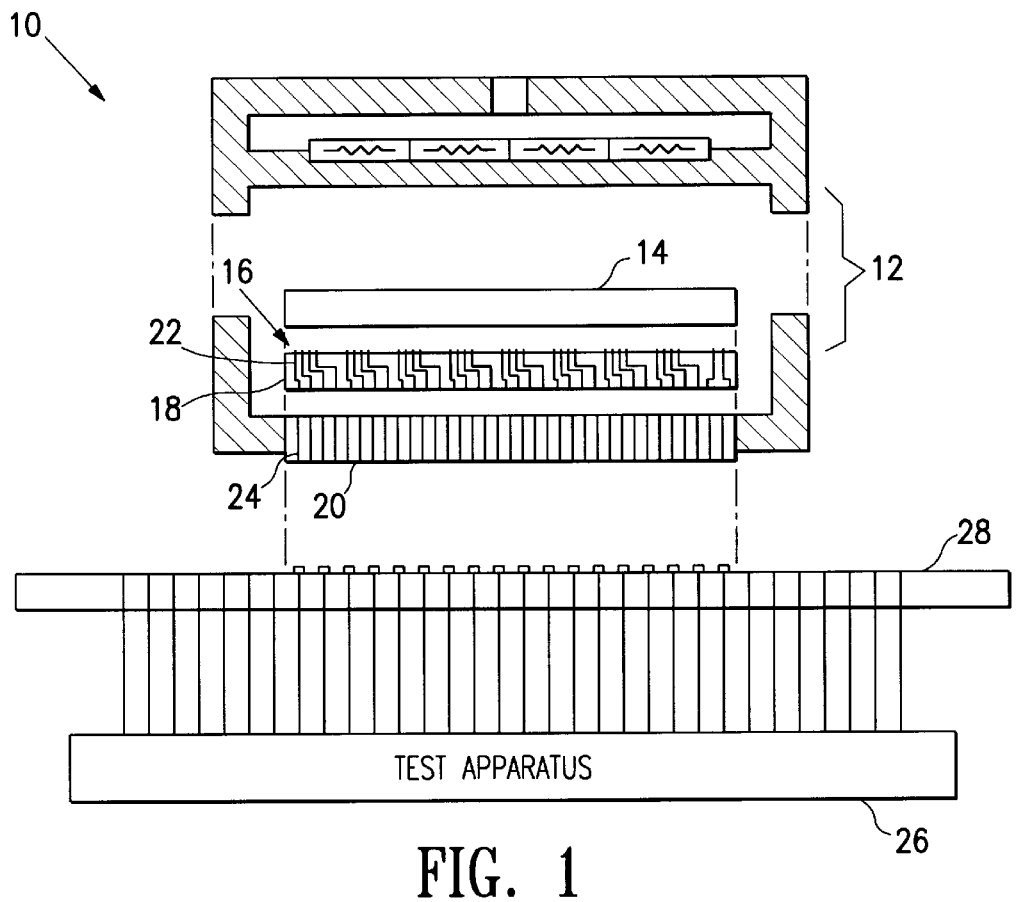
FIG. 1 is a cross sectional view of a wafer probe system of the present invention for providing an elastic probe assembly to bonding pads on a semiconductor wafer, including an adapter for connecting the wafer probe cassette to a test apparatus.

As shown in FIG. 1, a wafer probe system 10 may include upper and lower portions of a cassette 12 for carrying a semiconductor wafer 14. Preferably, the wafer probe system 10 is used to simultaneously test a number of dies on a wafer over a range of desirable test conditions. One or more probe tip assemblies 16 provide an elastic or deformable electrical contact to bonding pads (not shown) or other test contact points provided on the downward-turned surface of the semiconductor wafer 14. These bonding pads or test contacts are coupled to one or more dies formed on the wafer. The wafer probe system includes a ceramic substrate 18 that supports the probe tip assemblies 16 and an elastic member 20 (e.g., a pressure sensitive conductive rubber surface formed at the lower portion of the cassette 12) that applies a mating pressure to the ceramic substrate 18. As shown in FIG. 1, the ceramic substrate 18 and the elastic member 20 each include at least one conductive feed through, respectively 22 and 24, for passing signals to and/or from a test apparatus 26, e.g., via an adapter 28. In operation, a wafer 14 is placed into the cassette 12 for testing and/or burn in. By applying pressure to the elastic member 20, pressure is also applied via the ceramic substrate 18 to the probe tip assemblies 16 to force contact with the bonding pads of the semiconductor wafer 14. Electrical signals can then pass to and/or from the test apparatus 26 via one or more bonding pads to the dies on the wafer 14. Resulting test signals are then provided back to the test apparatus 26 for evaluating the status of dies on the wafer 14. As described further below, the preferred embodiments of the present invention permit these signals to be reliably provided during test and/or burn-in cycles of various circuits and dies provided on the wafer 14.

Figure 2:
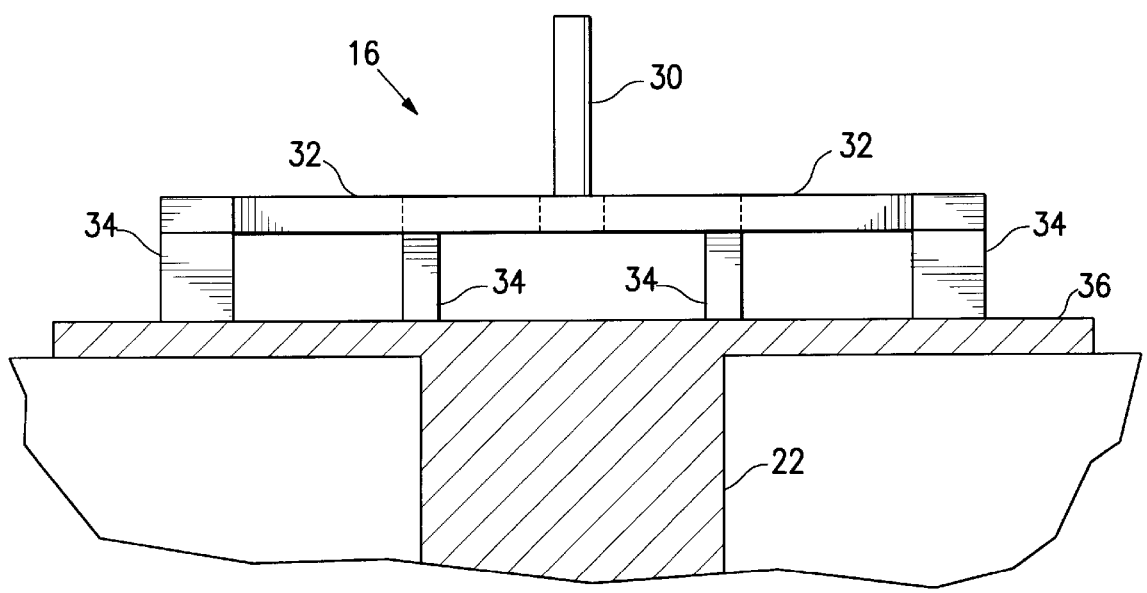
FIG. 2 is a cross sectional blow up view of the probe tip assembly of FIG. 1.
Figure 3:
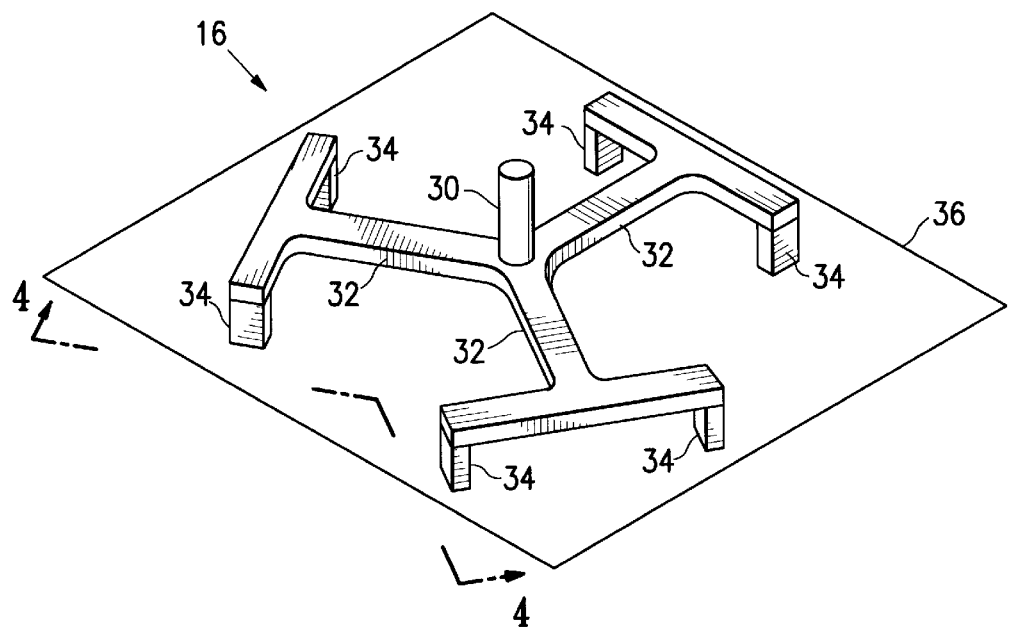
FIGS. 3 and 4 show isometric and side views, respectively, of an undeflected probe tip assembly of FIG. 2.
Figure 4:
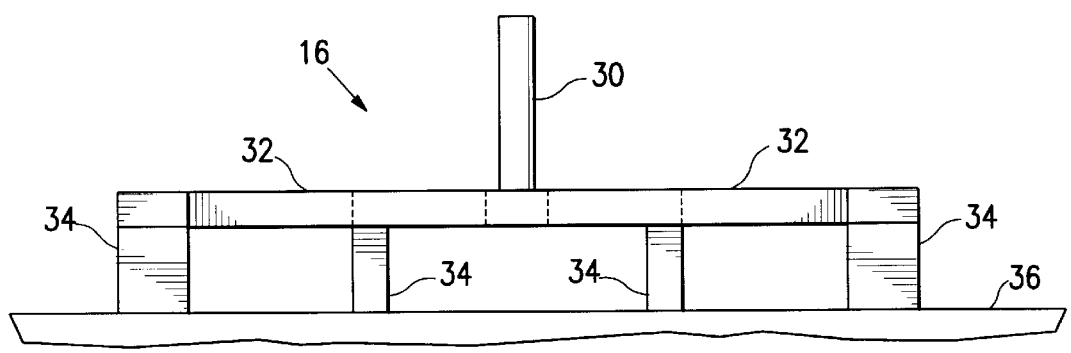
Figure 5:
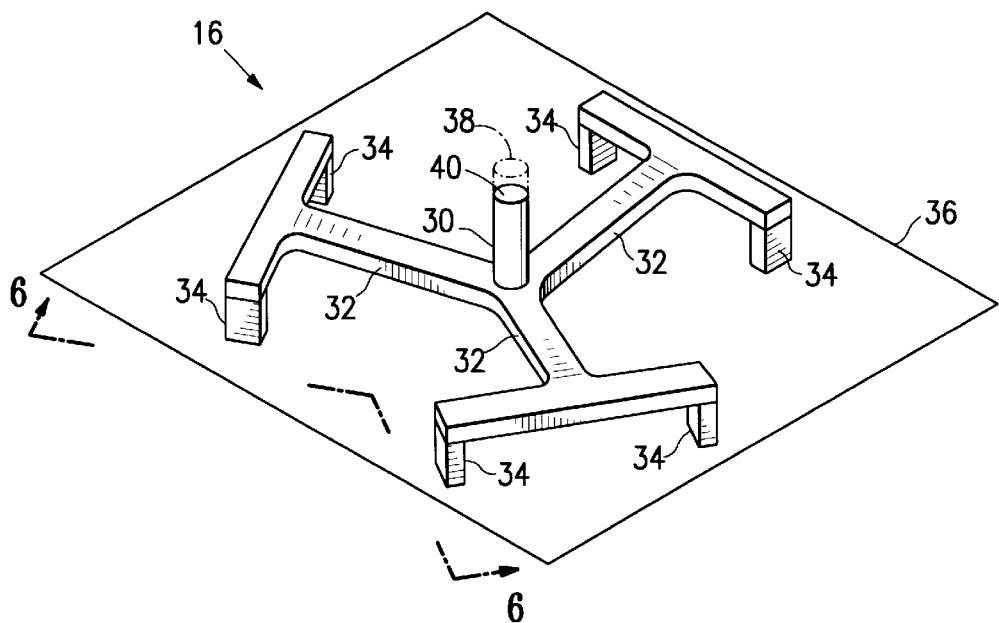
FIGS. 5 and 6 show isometric and side views, respectively, of a partially deflected probe tip assembly of FIG. 2.
Figure 6:
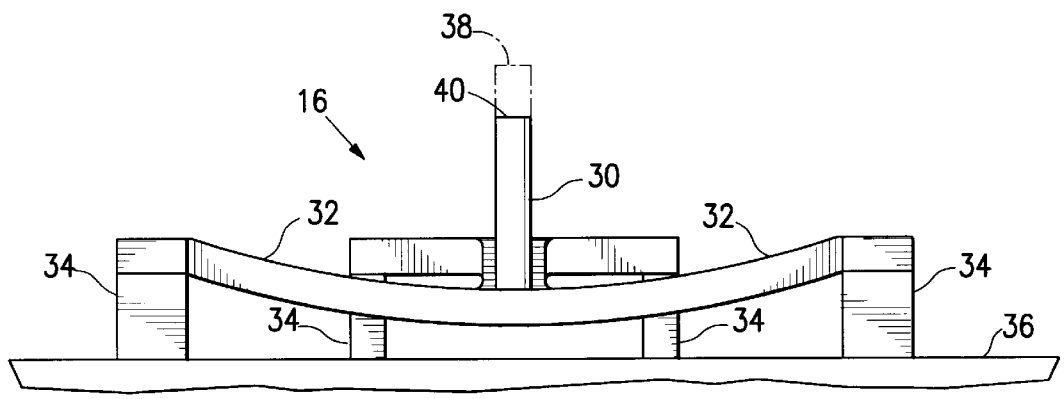
Figure 7:
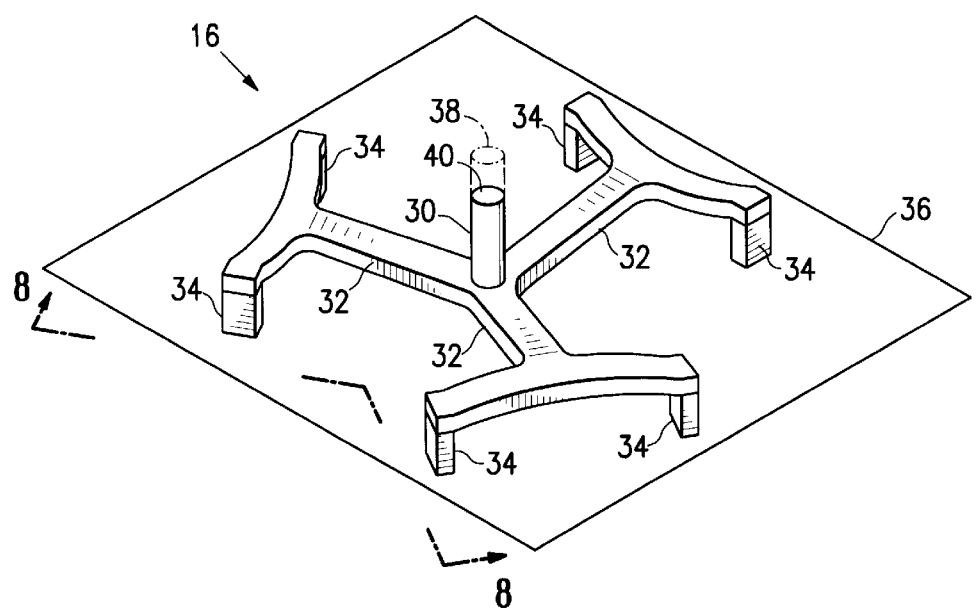
FIGS. 7 and 8 show isometric and side views, respectively, of a fully deflected probe tip assembly of FIG. 2.
Figure 8:
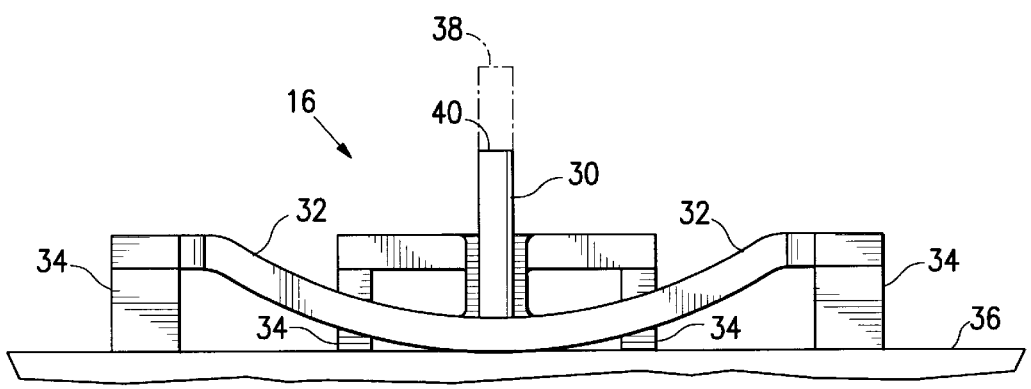

As shown in FIG. 3 in conjunction with FIG. 2, the flexible probe tip assembly 16 preferably includes an assembly of conductive members. One or more probe tips 30, preferably fabricated with tungsten (typically having a hardness of 485 kg/mm$^2$) or a similarly hard conductive material, are positioned on a flexible bridge member 32 (preferably fabricated from a metal alloy or a similar resilient conductive material) supported at its periphery by one or more bridge support members 34 (fabricated from tungsten or a similar material). The support members are provided on a base member 36 (fabricated from copper or other material) mounted on the ceramic substrate 18. Preferably, the bridge member 32 is formed as a three-armed structure or a structure formed of three members meeting at a center to support the probe tip 30. As shown, the probe tip 30 is desirably spaced from the support members 34 to provide a cantilevered structure including arms of the bridge member 32. The arms of the bridge member 32 form individual cantilevers that enhance the ability of the probe tip 30 to deflect and the structure as a whole to elastically deform to an extent useful in connecting to an assembly of test contacts on one or more dies spaced on a surface of a wafer.

As a consequence of this structure, preferred embodiments of the present invention can provide a more uniform and predictable contact resistance and can reduce the contact force to the bonding pads which could otherwise cause damage. The more uniformly applied contact pressure can ensure that contact resistance is low and ensures that the contact resistance is more reliably at the designed or nominal level. The resilience of the structure limits the sudden pressure that the cassette 12 could apply to the wafer 14 within the cassette during movement of the cassette or if the wafer shifts unexpectedly within the cassette. The combined cassette and wafer probe assembly accommodates differences in the thermal coefficient between the wafer 14 and the ceramic substrate 18 holding the probe tip assemblies 16. Consequently, testing is performed more reliably over a greater temperature range.

When a wafer 14 is put into the wafer probe system 10 for testing and pressure is applied via the cassette 12 and elastic member 20, the pressure is thus also applied to the probe tips 30 and the bonding pads via the ceramic substrate 18. As the pressure increases (see FIGS. 5–8), the bridge member 32 tends to deflect to absorb the increased pressure. Accordingly, the probe tip assembly 16 can withstand a range of pressures while still maintaining the pressure from the probe tips 30 to the bonding pads within a desirable range by deflecting the probe tip 30 from position 38 to position 40.

Figure 9:
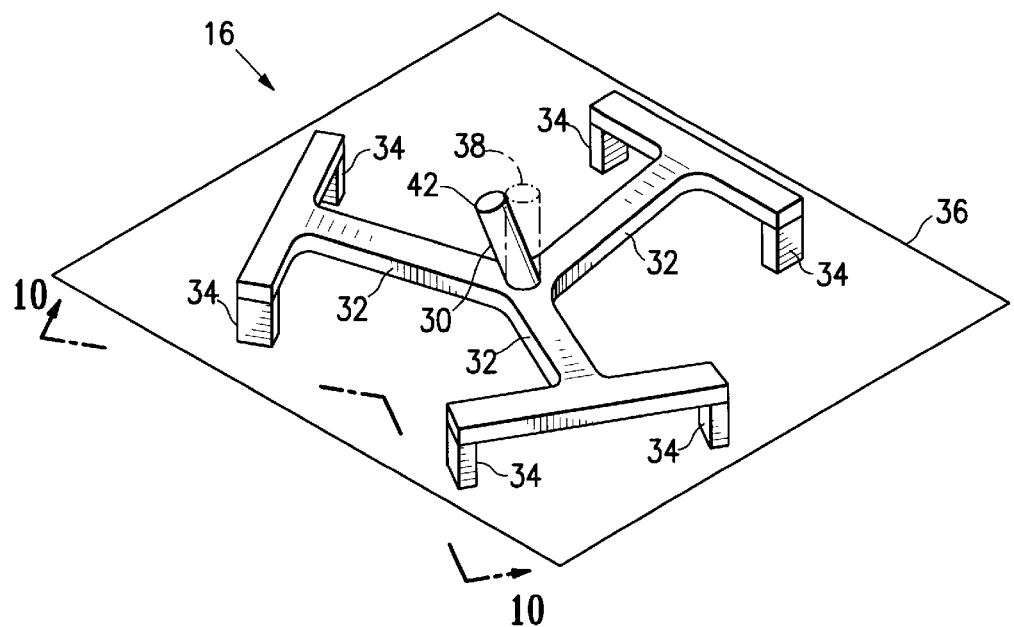
FIGS. 9 and 10 show isometric and side views, respectively, of the probe tip assembly of FIG. 2 showing how the probe tip deflects when pressure is applied to it vertically and horizontally, e.g., in response to temperature changes.
Figure 10:
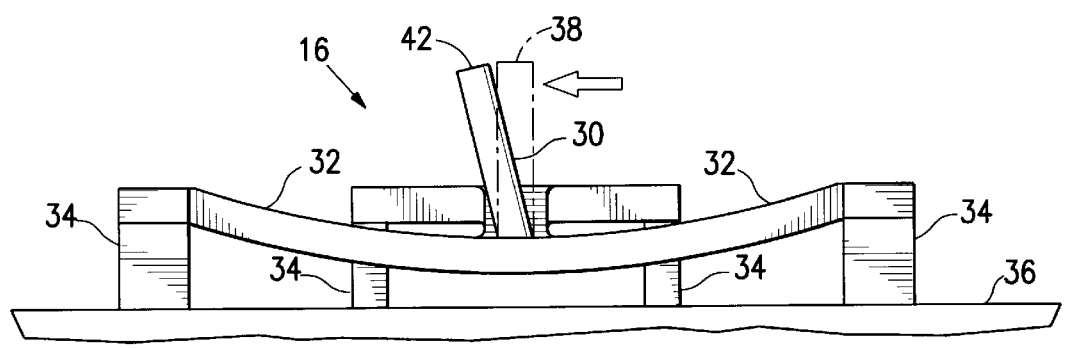

In a test or burn-in environment, the wafer 14 may be heated. When the wafer temperature equals a desired test temperature, the wafer under test will increase in size in accordance with its thermal expansion coefficient, as will the ceramic substrate 18 which supports the probe test assemblies 16. Under 70° C. the size of a wafer 14, e.g., an wafer) and the ceramic substrate 18 both increase, compared to their original size at room temperature. However, the size increase will typically be different for the wafer 14 and the ceramic substrate 18. Accordingly, the probe tip assembly 16 of the present invention is so formed to permit it to deflect to position 42 as shown in FIGS. 9–10 without losing contact with the bonding pad.

Consequently, it can be seen that preferred embodiments of the present invention are essentially self-adjusting according to the force and the direction of the force applied to the probe tips. Furthermore, this self-adjusting attribute allows these embodiments to compensate for roughness and coplanarity variations of the wafer 14, its bonding pads, or of the ceramic substrate 18.

Although the present invention has been described in detail with reference only to the presently-preferred embodiments, those of ordinary skill in the art will appreciate that various modifications can be made without departing from the invention. Accordingly, the invention is defined by the following claims.

What is claimed is:

1. A test piece probe assembly for adjustably providing an electrical coupling between a probe tip and a contact pad on a surface of a test piece, the assembly comprising:

a probe tip for contacting a surface of a contact pad;

a three-armed bridge member for supporting the probe tip;

one or more support members for supporting the bridge member, the probe tip laterally spaced from one or more support members;

a base member for supporting the support members, the base member for providing an electrical contact path to a test apparatus; and wherein the bridge member is capable of deflecting toward the base member as pressure is applied between the probe tip and the bonding pad.

2. The test piece probe assembly of claim 1 wherein the probe tip is fabricated from tungsten.

3. The test piece probe assembly of claim 1 wherein the bridge member is fabricated from a metal alloy.

4. The test piece probe assembly of claim 1 wherein the support member is fabricated from tungsten.

5. The test piece probe assembly of claim 1 wherein the base member is fabricated from copper.

6. The test piece probe assembly of claim 1 wherein the test piece is on a semiconductor wafer.

7. A wafer probe system for adjustably providing an electrical coupling between a test apparatus and one or more testing contacts on the surface of a test piece, the system comprising:

one or more electrically conductive probe tip assemblies providing electrical contact to the testing contacts on the test piece, each probe tip assembly including a probe tip independently movable with respect to other probe tips under pressures applied between the test piece and the one or more electrically conductive probe tip assemblies;

a ceramic substrate supporting the probe tip assemblies;

a member for flexibly providing a force to the probe tip assemblies via the ceramic substrate;

a cassette for supporting the wafer, the ceramic substrate and the member in contact with each other; and an electrically conductive feed through path for providing an electrical path between each probe tip assembly and a test apparatus, wherein each electrically conductive probe tip assembly comprises:

a metallic, three-armed bridge member centrally coupled to the metallic probe tip, one or more metallic support members coupled to the bridge member at its periphery, a metallic base member for supporting the support members, the base member being suitable for providing an electrical contact path to a test apparatus, and wherein the bridge member deflects toward the base member as pressure is applied between the probe tip and a bonding pad.

8. The wafer probe system of claim 7 wherein the probe tip is fabricated from tungsten.

9. The wafer probe system of claim 7 wherein the bridge member is fabricated from a metal alloy.

10. The wafer probe system of claim 7 wherein the support member is fabricated from tungsten.

11. The wafer probe system of claim 7 wherein the base member is fabricated from copper.

12. The wafer probe system of claim 7 wherein the test piece is a die on the surface of a semiconductor wafer.

13. A probe card assembly for establishing parallel electrical signal communications between a plurality of semiconductor chips on a wafer and external test equipment to determine the functionality and reliability of semiconductor chips and access speed of memory cells of semiconductor chips while the chips remain on the wafer, the probe card assembly comprising:

a substrate assembly; and a plurality of self-adjusting three-legged probe tips arranged over a surface of the substrate assembly to provide contacts between a test wafer and the external test equipment, the plurality of probe tips corresponding to a number of pads on a wafer and arranged in a manner such that each probe tip is aligned with a pad on a chip on the wafer.

14. The probe card assembly of claim 13 wherein each of the probe tips comprises a central post, there arms extending laterally from the central post and at least one leg extending vertically away from each of the arms.

15. The probe card assembly of claim 13 wherein the substrate assembly is made primarily of ceramic.

16. The probe card assembly of claim 13 wherein the three-legged probe tips are each positioned centrally on a three-leg supporting unit, each three-leg supporting unit comprising three T-shaped bridge members of equal length extending outwardly from the probe tip and each having a support member extending from each end of the T-shaped bridge member, each of the probe tips capable of deflecting toward when compressed and toward any of the T-shaped bridge members depending on from a direction of pressure the three-leg supporting unit provided on a base plate wherein the probe tips, the three-legged supporting unit including bridge members and supporting members and the base are made of electrically conductive materials.

* * * * *